United States Patent [19]
Nishi et al.

[11] Patent Number: 4,739,373
[45] Date of Patent: Apr. 19, 1988

[54] PROJECTION EXPOSURE APPARATUS
[75] Inventors: Kenji Nishi; Nobutaka Magome, both of Kawasaki, Japan
[73] Assignee: Nippon Kogaku K.K., Tokyo, Japan
[21] Appl. No.: 929,078
[22] Filed: Nov. 7, 1986
[30] Foreign Application Priority Data
  Nov. 8, 1985 [JP] Japan .................................. 60-249036
[51] Int. Cl.[4] ............................................. G03B 27/42
[52] U.S. Cl. ........................................ 355/53; 355/43; 355/70
[58] Field of Search ...................... 355/53, 43, 54, 67, 355/70

[56] References Cited
U.S. PATENT DOCUMENTS
3,718,396 2/1973 Hennings ................................ 355/53
4,437,758 3/1984 Suzuki ................................... 355/53

Primary Examiner—Monroe H. Hayes
Attorney, Agent, or Firm—M. N. Meller

[57] ABSTRACT

A projection exposure apparatus of the type which employs an alignment light of the same wavelength as an exposure light and includes an optical system subjected to correction of chromatic aberration for the exposure light so as to simultaneously observe an alignment area on a reticle and an alignment area on a photosensitive substrate to bring the reticle and the photosensitive substrate into alignment. The apparatus includes light source means for emitting light of a wavelength different from that of the exposure light and capable of sensitizing the photosensitive substrate, and optical means for introducing the light source means into the optical system to project it on to the alignment area on the photosensitive substrate through the alignment area on the reticle.

9 Claims, 4 Drawing Sheets

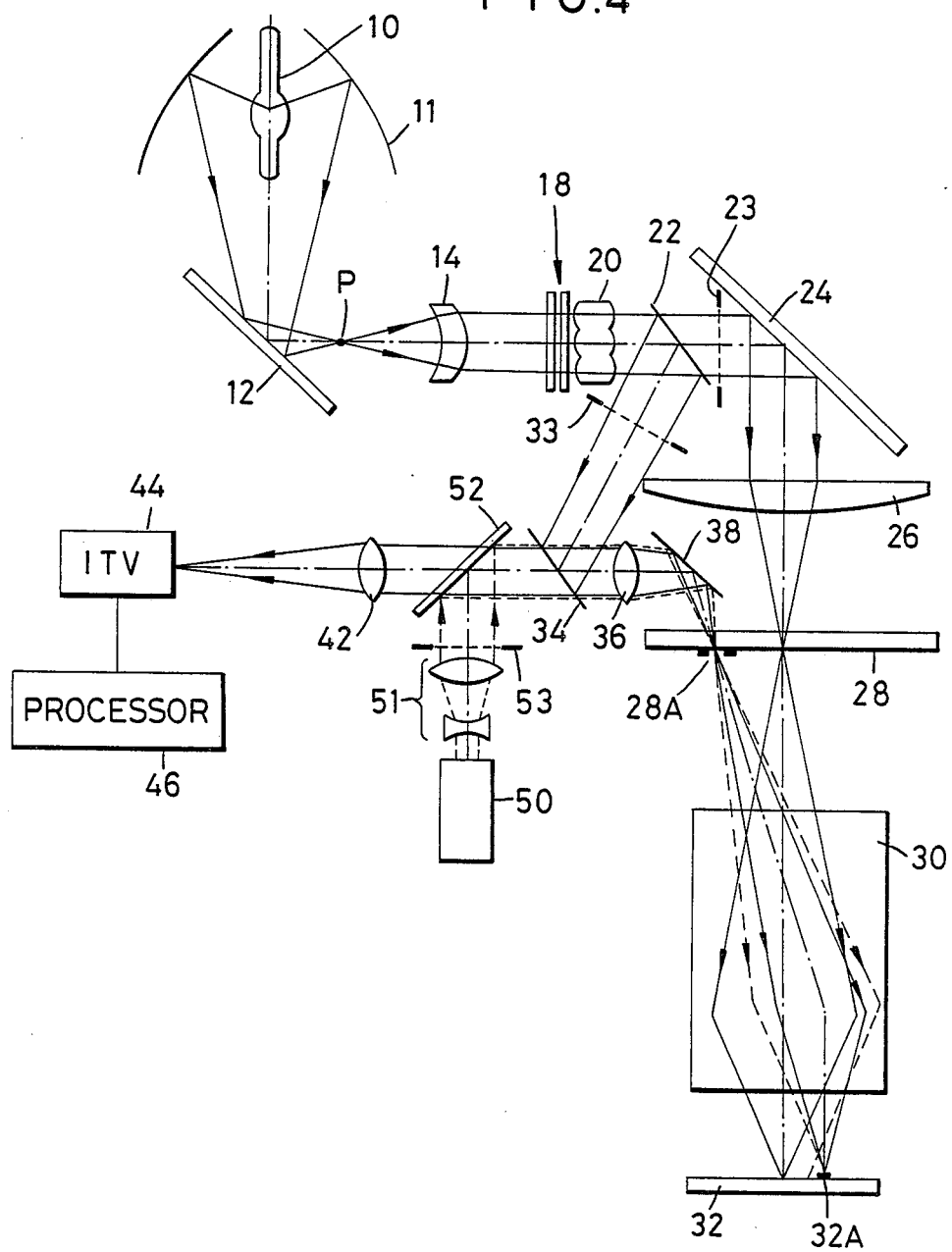

PROJECTION EXPOSURE APPARATUS

BACKGROUND OF THE INVENTION

1. Field of the Invention

The present invention relates to projection exposure apparatus for projecting the images of a pattern formed on a mask or reticle onto the photosensitive surface of a wafer and more particularly to an improved exposure apparatus capable of satisfactorily utilizing the same alignment mark formed on a wafer a plurality of times during alignment.

2. Description of the Prior Art

In a known exposure apparatus of the reduction projection type employing a reticle, for example, during alignment any diversion of the alignment reticle marks on a reticle from the alignment wafer mark on a wafer is measured and after the completion of the alignment the wafer is exposed at this alignment position. In this case, the pattern is imaged along with the reticle marks, on the wafer.

As a result, when the resist on the exposed wafer is developed and the wafer is then etched, the reticle marks are formed in the vicinity of the wafer mark and the wafer surface shape near the wafer mark is disturbed, thus giving rise to the danger of failing to use the wafer mark again as an alignment mark during the next alignment.

Thus, there have been known in the art a projection exposure apparatus so constructed that during each exposure the reticle mark is covered to prevent the reticle marks from being projected and printed on the wafer and a projection exposure apparatus so, designed that during each alignment a separate wafer mark formed at a different position is used. The former has the disadvantage of requiring the provision of a reticle mark covering device in the limited space above the reticle and complicating the construction of the apparatus and also the latter the disadvantage of requiring the provision of an increased space on the wafer for the formation of wafer marks and complicating the alignment operation for each wafer mark.

SUMMARY OF THE INVENTION

The present invention has been made in view of these circumstances and it is the primary object of the invention to provide an exposure apparatus so designed that the same alignment mark formed on a wafer can be used repeatedly for a plurality of alignment operations.

Thus, in accordance with the invention, noting the fact that with a light (e.g., the i line) having a wavelength different from that of an exposure light (e.g., the g line) for projecting the image of a pattern on a reticle or an alignment light (e.g., the g line) for observation of the alignment mark-containing alignment areas of the reticle and a photosensitive substrate (wafer), the image of the reticle pattern defocuses on the photosensitive substrate in relation with the chromatic aberration of a projection lens, a projection exposure apparatus of the type employing an alignment light of the same wavelength as an exposure light and adapted to align a reticle with a photosensitive substrate through the simultaneous observation of the alignment area on the reticle and the alignment area on the photosensitive substrate by an optical system subjected to correction of the chromatic aberration for the exposure light, includes light source means for emitting light of a wavelength to which the photosensitive substrate is sensitive and which is different from that of the exposure light, and optical means for introducing the light from the light source means into the optical system and projecting it to the alignment area on the photosensitive substrate through the alignment area on the reticle.

In accordance with this construction of the invention, by virtue of the fact that the alignment area on a wafer is exposed by using light which is different in wavelength from an exposure light, there is the effect of preventing the formation of any undesired pattern, e.g., steps in the vicinity of the alignment mark on the wafer due to the defocusing of the reticle marks, and satisfactorily protecting the wafer alignment mark during etching, thus allowing repeated use of the same alignment mark.

There is another effect that if the illumination by such light is effected during each alignment or exposure, the apparatus will be simplified in construction and the processing time will be reduced as compared with the conventional site-by-site system in which the exposure position is shifted from the alignment position and another conventional system of effecting the exposure by covering only the alignment area. Also, the simultaneous projection of light (the i line) of a sensitizing wavelength in addition to an alignment illuminating light (the g line) means that the amount of light energy applied to the resist is increased and changes in the optical characteristics (refractive index, reflectivity, etc.) of the resist itself are stabilized in a short period of time (less than 1 second). Thus, there is an effect that when detecting the wafer mark by dark-field illumination, the wait time (the interval of time between the time that the projection of the illuminating light is started and the time that the taking of an image signal is started) is reduced considerably with the resulting improvement of the throughput.

The other object, features and advantages of the invention will become more apparent from the following description taken in conjunction with the accompanying drawings.

BRIEF DESCRIPTION OF THE DRAWINGS

FIG. 4 illustrates the construction of a second embodiment of the invention.

DESCRIPTION OF THE PREFERRED EMBODIMENTS

Preferred embodiments of the invention will now be described in detail with reference to the accompanying drawings.

Figure 1:
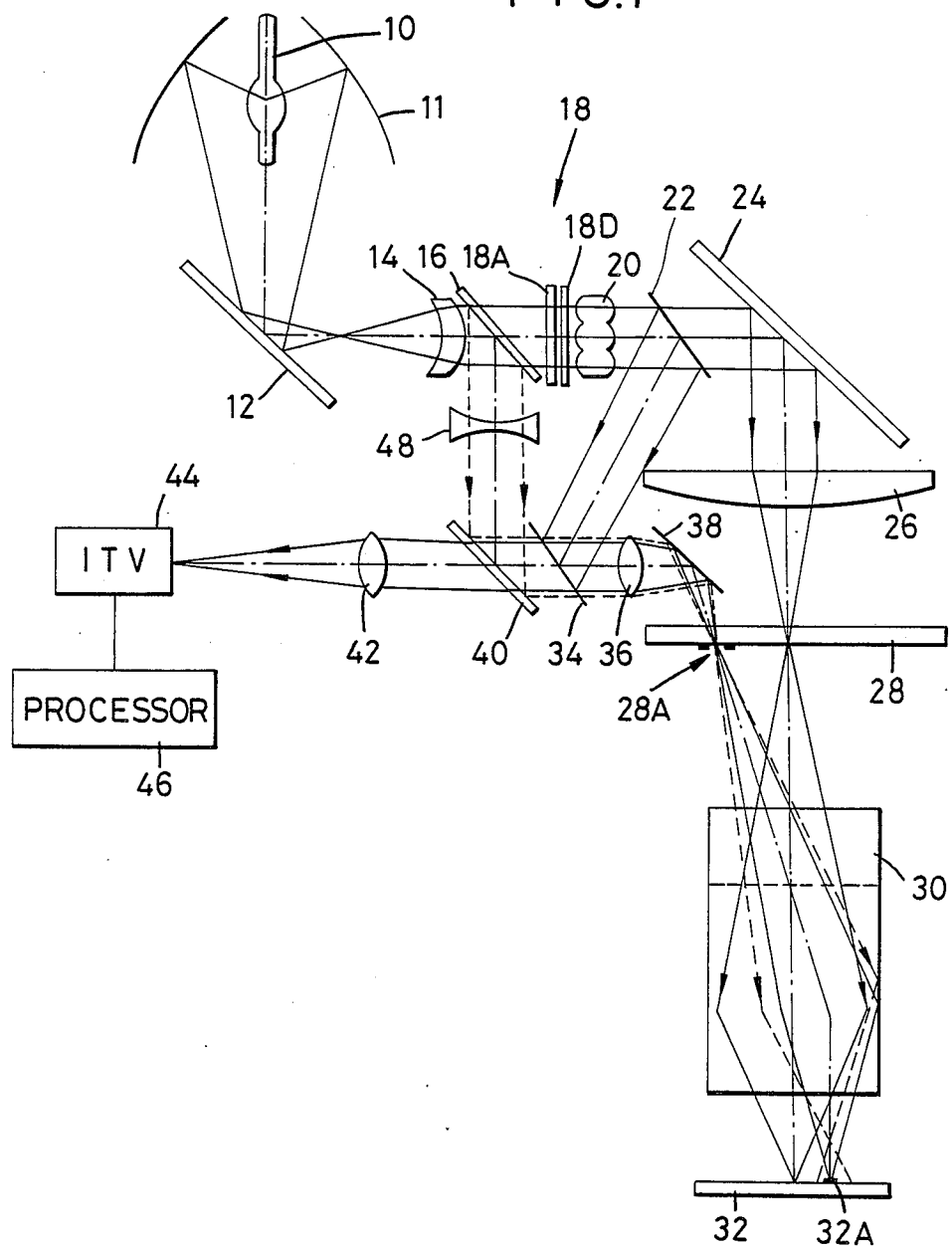
FIG. 1 illustrates the construction of a first embodiment of the invention.

FIG. 1 illustrates the principal parts of an exposure apparatus according to an embodiment of the invention.

In the figure, of the emitted light of an ultra-high pressure mercury-vapor lamp 10 forming a light source, the g line (wavelength=436 nm) and i line (wavelength=365 nm) are reflected by an elliptic reflecting mirror 11 and a dichroic mirror 12, formed into a collimated light beam by a condensing lens 14 and projected to an i-line reflection type half mirror 16. The emitted light other than the g and i lines is not projected to the condensing lens 14 since it is transmitted through the dichroic mirror 12.

Then, of the g and i lines, the g line is transmitted through the i-line reflection type dichroic mirror 16 and then it falls on a half-mirror 22 after passing through a g-line transmission filter 18 and an optical integrator 20 consisting of a flyeye lens. A large number of small secondary light sources are formed on the exit surface of the optical integrator 20. The g line passing through the half-mirror 22 is reflected by a g-line reflection mirror 24 so that the g line illuminates a reticle 28 through a condenser lens 26 and it is further transmitted through a projection lens 30 to reach a wafer 32, thereby projecting an image of the pattern formed on the reticle 28 onto the wafer 32 for imaging.

On the other hand, the g line reflected by the half-mirror 22 is further reflected by a half-mirror 34 and then, after being condensed by a condensing lens 36, the g line is reflected by a reflecting mirror 38 to fall on a window portion including alignment reticle marks 28A on the reticle 28. The pattern image (reticle mark image) produced by the g line transmitted through the reticle 28 is formed at the position of a wafer alignment mark 32A on the wafer 32 through the projection lens 30. Then, the g line is reflected by the wafer 32 so that it goes back over its way to fall on the half mirror 34 through the projecting lens 30, the reticle 28, the reflecting mirror 38 and the condensing lens 36 and after passing through the half mirror 34, the g line is imaged on a television monitor 44 through an i-line reflection type dichroic mirror 40 and a condensing lens 42, thereby permitting simultaneous observation of the alignment reticle marks 28A and the wafer alignment mark 32A. An alignment processor 46 is connected to the television monitor 44 so that the desired alignment between the reticle 28 and the wafer 32 is accomplished in accordance with the relative positional relation between the reticle marks 28A and the wafer alignment mark 32A observed on the television monitor 44.

On the other hand, the i line (collimated light beam) reflected by the i-line reflection type dichroic mirror 16 is reflected by the other i-line reflection type dichroic mirror 40 through a lens 48 so that it falls on the small window containing the reticle marks 28A of the reticle 28 through the half-mirror 34, the condensing lens 36 and the reflection mirror 38 and it further falls on the alignment area containing the wafer alignment mark 32A of the wafer 32 through the projection lens 30. The projection lens 30 has been corrected in chromatic aberration only for the g line and therefore the image of the marks 28 produced by the i line is not formed but defocussed on the wafer 32. Of course, the marks 28A are imaged at a position apart from the surface of the wafer 32 but this distance is such that the image is shifted greatly from the depth of focus of the projection lens 30 and consequently it is defocussed on the wafer 32.

With these conponent parts, the i line reflected by the wafer 32 follows back over its way and it is reflected by the i-line reflection type dichroic mirror 40, thereby preventing it from falling on the television monitor 44.

On the other hand, the condensing lens (objective lens) 36 is arranged such that the g line transmitted as an illuminating light for the reticle mark 28A is converged (focused) at the portion of the reticle mark 28A. Thus, if the i line projected under the same optical conditions as the g line incident to the condensing lens 36, the i line is not imaged on the reticle 28 but expanded, thus giving rise to the danger of decreasing the quantity of light passed through the small window containing the reticle marks 28. This is also due to the chromatic aberration of the condensing lens 36. Thus, the convex lens 48 is arranged such that the incident conditions of the i line to the condensing lens 36 differ from those of the g line and the i line is focussed and imaged on the reticle 28. Of cource, the lens 48 is not required if the condensing lens 36 is corrected in chromatic aberration for both of the g and i lines.

Where the alignment is made by the g line reflected from the half-mirror 22, it is arranged so that the g line transmitted through the half-mirror 22 for the purpose of projection exposure is blocked by the exposure shutter (not shown) positioned in the illuminating light path between the half-mirror 22 and the g-line reflection type mirror 24 and thus it is prevented from reaching the reticle 28. Also, the light path between the half-mirror 22 and 24 and the light path between the i-line reflection type dichroic mirrors 16 and 40 are blocked by the shutters (not shown) arranged in these light paths such that the alignment light (g line) and the exposure light (i line) for the alignment area containing the wafer alignment mark 28A are prevented from reaching the wafer 32 during the time that the wafer 32 is moved to a different position on the wafer 32 for step-and-repeat exposure purposes.

The overall operation of the above-described embodiment will now be described.

Figure 3A:
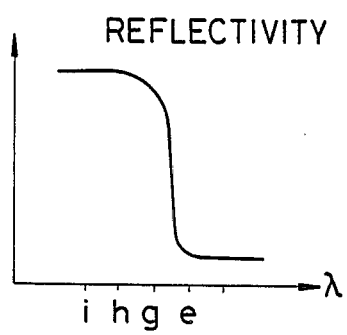
FIG. 3A to 3E are graphs showing by way of example optical characteristics of the dichroic mirrors and filter used in the embodiment of FIG. 1, with FIG. 3A showing a reflectivity characteristic of the mirror which reflects the g and i lines, FIG. 3B showing a transmissivity characteristic of the i-line reflection type mirror, FIGS. 3C and 3D showing transmissivity characteristics of the g-line transmission interference filter, and FIG. 3E showing a reflectivity characteristic of the i-line reflection mirror.

The operation of the exposure optical system will be described first. The light emitted from the ultra-high pressure mercury-vapor lamp 10 is projected to the dichroic mirror 12 through the elliptic mirror 11. The dichroic mirror 12 has a light wavelength $\lambda$ versus reflectivity characteristic such as shown in FIG. 3A so that the g line and the i line are reflected and projected onto the i-line reflection type dichroic mirror 16 through the condensing lens 14.

Figure 3D:
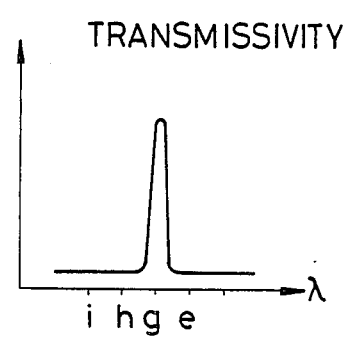
Figure 3B:
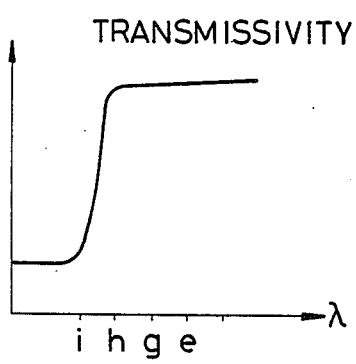
Figure 3E:
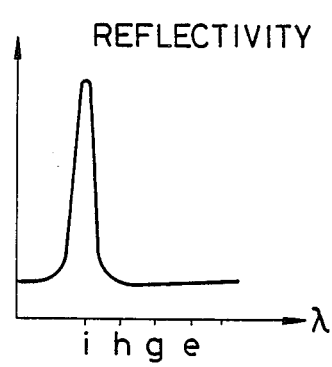
Figure 3C:
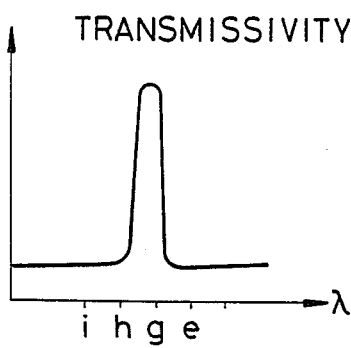

Then, the i-line reflection type dichroic mirror 16 has a transmissivity characteristic as shown in FIG. 3B so that of the incident light, the i line and the light of shorter wavelengths than the i line are strongly reflected and the light of longer wavelengths than it are transmitted. Then, the transmitted light is projected to the g-line transmission filter (interference filter) 18 including a pair of filters 18A and 18B. Here, the filter 18A has a transmissivity characteristic such as shown in FIG. 3C and the filter 18B has a transmissivity characteristic such as shown in FIG. 3D, with the result that the g line is extracted by double filtering and it is then projected to the optical integrator 20 and hence to the half-mirror 22. The bandwidth of the filter 18B is smaller than the bandwidth of the filter 18A and therefore only the spectrum of the g line is passed efficiently by the two filters 18A and 18B. FIG. 3E shows a transmissivity characteristic of the i-line reflection type dichroic mirror 40 which is designed to reflect only the i line.

The g line transmitted through the half-mirror 22 is projected to the pattern portion of the reticle 28 through the g-line reflection mirror 24 and the condenser lens 26. In other words, the exposure g line is projected with a uniform light intensity onto the whole surface of the pattern portion of the reticle 28 in a stable manner through the g-line transmission filter 18, the optical integrator 20 and the condenser lens 26. After illuminating the reticle 28, the g line is transmitted through the reticle 28 and it is then transmitted through the projection lens 30 to reach the wafer 32, thereby imaging the pattern of the reticle 28 on the wafer 32 and effecting the exposure.

Then, when the exposed wafer 32 has been subjected to such operations as development, etching, resist removing, etc., an impression corresponding to the pattern on the reticle 28 is formed first. However, the wafer surface portion corresponding to the reticle marks 28A is exposed to the i line, which will be described later in detail, and therefore this wafer portion is not etched, thus forming no impression corresponding to the reticle marks 28A. As a result, the alignment area around the wafer alignment mark 32A retains its initial state as such and thus the wafer alignment mark 32A can be used repeatedly during the succeeding aligning operations.

Next, the alignment optical system will be described. Firstly, the g line transmitted through the half-mirror 22 is blocked by the shutter, which is not shown, and therefore it is put in a condition which does not illuminate the reticle 28.

A portion of the g line passing through the integrator 20 falls on the reticle marks 28A portion of the reticle 28 through the half-mirrors 22 and 34, the condensing lens 36 and the reflecting mirror 38 and also it illuminates the wafer alignment mark 32A portion of the wafer 32 through the projection lens 30. Then, this g line is reflected by the wafer surface corresponding to the pattern of the wafer alignment mark 32A so that it travels back over its way through the projection lens 30, the reticle 28, the reflecting mirror 38 and the condensing lens 36, passes through the half-mirror 34, follows the detection light path diverging from its way and falls on the television monitor 44 through the i-line reflection type dichroic mirror 40 and the condensing lens 42. As a result, both of the images of the reticle marks 28A and the wafer alignment mark 32A are observed in focus on the television monitor 44 and the alignment processor 46 brings the reticle 28 and the wafer 32 into alignment in accordance with the relative positional relation of the two images. At this time, due to the use of the g line, a pattern of the reticle mark 28 is printed by exposure in the vicinity of the wafer alignment mark 32A of the wafer 32.

Figure 2:
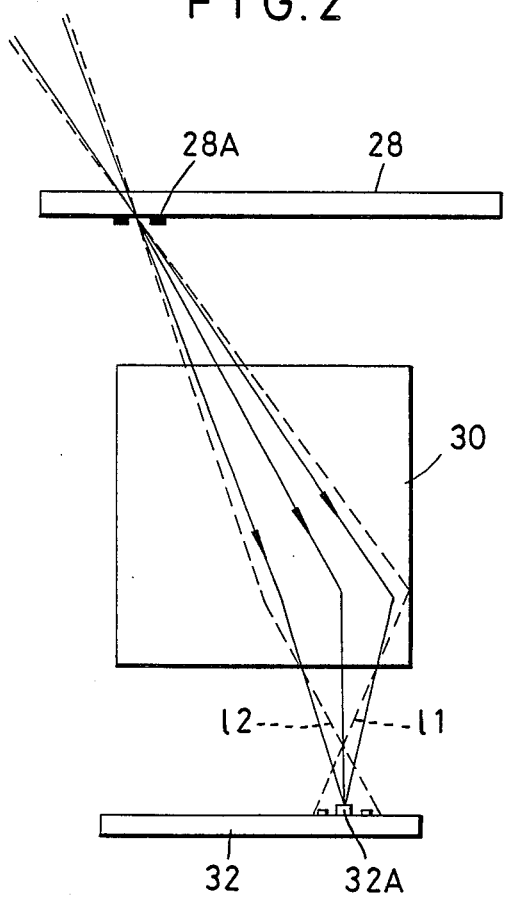
FIG. 2 is an enlarged view showing the imaging conditions of the g-line and i-line lights during the alignment operation in the embodiment of FIG. 1.

On the other hand, the i line introduced into the alignment optical system through the i-line reflection type dichroic mirrors 16 and 40 reachs the wafer alignment mark 32A portion of the wafer 32 through the half-mirror 34, the condensing lens 36, the reflecting mirror 38 and the projection lens 30 in the like manner as the g line. However, since the chromatic aberration correction of the projection lens 30 has been made only for the g line and no color correction has been made for the i line, as shown in the enlarged view of FIG. 2, the image of the reticle marks 28A by the i line is not formed on the wafer 32 and thus it is defocused. Note that in FIG. 2, solid lines 11 show the image forming light beam of the g line and broken lines 12 show the image forming light beam of the i line. As a result, the i line comes round to the pattern portion printed as a result of the alignment by the g line and the i line illuminates the portions unexposed to the g line due to the reticle marks 28A (the dark area corresponding to the marks 28A). Thus, the resist on the alignment area including the wafer alignment mark 32A and its surrounding portion is exposed are printed by the i line and this portion is protected by the exposed resist. Thus, this portion is not etched away. Thus, the wafer alignment mark 32A and its surrounding portion are maintained in their initial conditions without any deformation. This permits the wafer alignment mark 32A to be used repeatedly for alignment purposes.

When the above-mentioned alignment procedure has been completed, the exposure shutter (not shown) is opened and the projection exposure of a pattern by the g line is performed. It is to be noted that the illumination of the alignment mark portions may be effected during each exposure and not during alignment.

While, in the above-described first embodiment, the i and g lines of the mercury-vapor lamp are used, a light source for illuminating the alignment mark portions may be provided separately. Further, by using a laser beam of a wavelength capable of sensitizing the resist, e.g., Ar laser beam of 488 nm or HeCd laser beam of 325 nm, it is possible to rapidly sensitize the resist, reduce the wait time and effect a die-by-die alignment very quickly.

FIG. 4 shows the construction of an exposure apparatus according to a second embodiment of the invention so designed that the alignment area on a wafer is exposed by using a laser light source of a wavelength different from the g line of an ultra-high pressure mercury-vapor lamp instead of its i line. The construction of this embodiment excluding the laser light source portion is identical with that of the first embodiment. Thus, the component parts having the same function as in FIG. 1 are designated by the same reference numerals and will not be described in detail.

In FIG. 4, a laser light source 50 produces a laser beam (e.g., HeCd laser beam of 325 nm) capable of sensitizing the resist on a wafer 32 so that the laser beam is expanded to a suitable beam width by a beam expander 51 and it is then reflected by a dichroic mirror 52 obliquely arranged in the alignment light path between a half-mirror 34 and a condensing lens 42. Then, the laser beam is concentrated into a small window portion including reticle marks 28A formed on a reticle 28 through a condensing lens 36 and a reflecting mirror 38. In this case, the condensing lens 36 is not color corrected for the wavelength of the laser beam and therefore the beam expander 51 is arranged so as to impart a slight divergence to the laser beam directed to the condensing lens 36 such that the laser beam is focused on the same position as the focal plane of the alignment light or g line, i.e., the position of the reticle marks 28A. It is to be noted that in the embodiment of FIG. 4 only the g line of the light from an ultra-high pressure mercury-vapor lamp 10 is utilized and therefore a dichroic mirror 12 should preferably comprise a mirror having a high reflectivity particularly for the g line as in the case of a g-line reflection mirror 24. Also, disposed on the exposure light path between a half-mirror 22 and the g-line reflection mirror 24 is a shutter 23 which is capable of blocking the exposure light arbitrarily and disposed on the light path between the half-mirrors 22 and 34 is a shutter 33 which is capable of blocking the alignment illuminating light arbitrarily. Also, a shutter 53 capable of blocking the laser beam arbitrarily is arranged between the beam expander 51 and the mirror 52.

The light emitted from the ultra-high pressure mercury-vapor lamp 10 and including the wavelength of the g line is condensed at a point P through an elliptic mirror 11 and the dichroic mirror 12, converted to a collimated light beam by a condensing lens 14 and then passed through a g-line transmission filter 18 and an optical integrator 20 to fall on the half-mirror 22. A portion of the light beam (g line) transmitted through the half-mirror 22 illuminates the reticle 28 uniformly through the g-line reflection mirror 24 and a condenser lens 26. Thus, the pattern on the reticle 28 is illuminated by the g line and projected in reduced form on a wafer 32 through a projection lens 30.

The light beam (g line) reflected from the half-mirror 22 is focused on reticle marks 28A of the reticle 28 through the half-mirror 34, the condensing lens 36 and the reflecting mirror 38, transmitted through the small window including the reticle marks 28A and then focused again on a wafer alignment mark 32A of the wafer 32 through the projection lens 30. Then, the g line is reflected by the wafer 32 so that as in the case of the embodiment of FIG. 1, the g line is transmitted through the projection lens 30, the reticle 28, the condensing lens 36, the half-mirror 34 and the dichroic mirror 52 and it is imaged on a television monitor 44, thus permitting the reticle marks 28A and the wafer alignment mark 32A to be observed simultaneously.

On the other hand, the laser beam emitted from the laser light source 50 is expanded to a suitable beam width by the beam expander 51, reflected by the dichroic mirror 52, transmitted through the half-mirror 34 and then condensed into the small window including the reticle marks 28A on the reticle 28. The laser beam passed through the small window is projected onto the wafer 32 through the projection lens 30, thus exposing the alignment area including the wafer alignment mark 32A and its surrounding area. Thus, this alignment area is not etched remains as such.

The shutter 23 is opened only during exposure and the shutter 33 is opened only during alignment. Also, the laser beam is emitted from the laser light source 50 in response to the opening of the shutter 23. Since the second embodiment uses the same wavelength for the exposure light and the alignment light, the alignment accuracy is improved as in the case of the first embodiment and moreover the strong laser beam is used for the exposure of the alignment area surrounding the wafer alignment mark 32, thus completing the exposure in a very short period of time. Also, while, in the second embodiment, the laser light source 50 comprises an HeCd laser which emits a laser beam having a shorter wavelength than the i line or 325 nm, it is possible to use an Ar laser (488 nm) of a longer wavelength than the g line.

Further, in the case of a recently developed apparatus which employs the i line of light as an exposure light to obtain a higher resolution, it is only necessary to arrange so that the g line is used for the exposure of an alignment area and the i line is used for the purpose of die-by-die alignment. Thus, in the case of the embodiment of FIG. 1, it is necessary to use a g-line reflection type dichroic mirror for each of the mirrors 16 and 40 an i-line transmission filter for the filter 18. Then, the projection lens 30 and the condensing lens 36 are color corrected only for the i line and an i-line reflection mirror is used for the mirror 24. Also, in this case, the projection of the g line having a sensitizing wavelength other than that of the illuminating light used in the essential alignment or the light reflected by the half-mirror 22 need not be performed simultaneously during the alignment and the same effect can be obtained by performing the projection during the exposure time after the alignment.

We claim:

1. A projection exposure apparatus comprising:
    exposure illuminating optical means including first light source means for emitting light of a first wavelength capable of sensitizing a photosensitive substrate to illuminate a pattern on a reticle;
    projecting optical means subjected to correction of chromatic aberration for said light of first wavelength and arranged to project the pattern on said reticle onto said photosensitive substrate;
    alignment detecting optical means for registering an first alignment area including first alignment mark means formed on said reticle and a second alignment area including second alignment mark means formed on said photosenitive substrate through said projection optical means to detect relative positions of said first alignment mark means and said second alignment mark means;
    second light source means for emitting light of a second wavelength capable of sensitizing said photosensitive substrate, said projecting optical means not subjected to correction of chromatic aberration for said second wavelength; and
    means for projecting said light of second wavelength through said projectioning optical means to expose said second alignment area.

2. An apparatus according to claim 1, wherein said alignment detecting optical means includes means for extracting said light of first wavelength passed through said first and second alignment areas whereby said relative positions are detected by the use of said extracted light of first wavelength.

3. An apparatus according to claim 1, wherein said alignment detecting optical means includes means for directing a portion of said light of first wavelength emitted from said first light source means to said first alignment area, and means for focusing said light of first wavelength directed by said directing means on said first alignment mark means whereby said second alignment area is exposed by said light of first wavelength focused by said focusing means through said projecting optical means.

4. An apparatus according to claim 1, wherein said first light source means emits at least said light of first wavelength and includes optical filtering means for extracting said light of first wavelength, and wherein said second wavelength projecting means includes a dichroic mirror arranged on a detection light path of said alignment detecting optical means.

5. An apparatus according to claim 1, wherein said first light source means and said second light source means includes in common an ultra-high pressure mercury-vapor lamp for emitting said light of first wavelength and said light of second wavelength, wherein said second light source means includes means for extracting said light of second wavelength included in a beam of light emitted from said ultra-high pressure mercury-vapor lamp, and wherein said first light source means includes filtering means for transmitting only said light of first wavelength.

6. A projection exposure apparatus comprising:

a projection optical system subjected to correction of chromatic aberration for light of a first wavelength used for projecting an image of a pattern on a reticle to a photosensitive substrate, said projecting optical system not subjected to correction of chromatic aberration for light of a second wavelength different from said first wavelength and capable of sensitizing said photosensitive substrate; and an alignment optical system for simultaneously observing a first alignment area including first alignment mark means on said reticle and a second alignment area including second alignment mark means on said photosensitive substrate by the use of an alignment light of the same wavelength as said first wavelength through said projecting optical system, thereby bringing said reticle and said photosensitive substrate intop alignment, said alignment optical system comprising light source means for emitting said light of second wavelength, and optical means for introducing said light of second wavelength into said projecting optical system to illuminate said second alignment area through said first alignment area whereby said alignment light of the same wavelength is condensed on said photosensitive substrate and said light of second wavelength is dispersed within said second alignment area.

7. An apparatus according to claim 6, wherein said light source means comprises a laser light source for emitting a beam of a wavelength different from said first wavelength, and wherein said optical means includes for projecting the laser beam from said laser light source into said first alignment area, means for expanding the beam width of said laser beam, and means for directing said laser beam expanded by said beam expander to said projecting means.

8. An apparatus according to claim 6, wherein said light source means comprises an ultra-high pressure mercury-vapor lamp for emitting said light of first wavelength as well as said light of second wavelength, and wherein said optical means includes means for dividing a beam of light from said ultra-high pressure mercury-vapor lamp into said light of first wavelength and said light of second wavelength, and means for projecting said light of second wavelength divide by said dividing means into said first alignment area.

9. An apparatus according to claim 8, wherein said optical means further includes a half-mirror for directing said light of first wavelength divided by said dichroic mirror to said projecting means.

* * * * *